(12) United States Patent
Sakamoto

(10) Patent No.: US 7,399,928 B2
(45) Date of Patent: Jul. 15, 2008

(54) FLEXIBLE FLAT CABLE AND METHOD OF MANUFACTURING THE SAME

(75) Inventor: Kazuhiko Sakamoto, Kawagoe (JP)

(73) Assignee: Pioneer Corporation, Tokyo (JP)

( * ) Notice: Subject to any disclaimer, the term of this patent is extended or adjusted under 35 U.S.C. 154(b) by 349 days.

(21) Appl. No.: 11/131,330

(22) Filed: May 18, 2005

(65) Prior Publication Data

US 2006/0011374 A1 Jan. 19, 2006

(30) Foreign Application Priority Data

Jul. 16, 2004 (JP) .............................. 2004-210163

(51) Int. Cl.
*H01B 7/08* (2006.01)
(52) U.S. Cl. .................................................. 174/117 F
(58) Field of Classification Search .............. 174/117 F, 174/117 FF
See application file for complete search history.

(56) References Cited

FOREIGN PATENT DOCUMENTS

| JP | 401149304 | * | 6/1989 |
| JP | 2001-043743 | A | 2/2001 |
| JP | 2001073186 | * | 3/2001 |
| JP | 2002025353 | * | 1/2002 |
| JP | 2004111072 | * | 4/2004 |

\* cited by examiner

*Primary Examiner*—Chau N Nguyen
(74) *Attorney, Agent, or Firm*—Foley & Lardner LLP

(57) ABSTRACT

A method is provided for manufacturing a flexible flat cable that is prepared by covering a conductor unit including a plurality of tin-alloy plated conductors with an insulation base material such that the conductor unit is stripped at both ends. The method includes a first step of preparing the conductor unit including the tin-alloy plated conductors and an insulator that is present between the tin-alloy plated conductors; a second step of heat treating the prepared conductor unit; and a third step of covering the heat-treated conductor unit with the insulation base material such that the conductor unit is stripped at both ends.

6 Claims, 4 Drawing Sheets

PRIOR ART

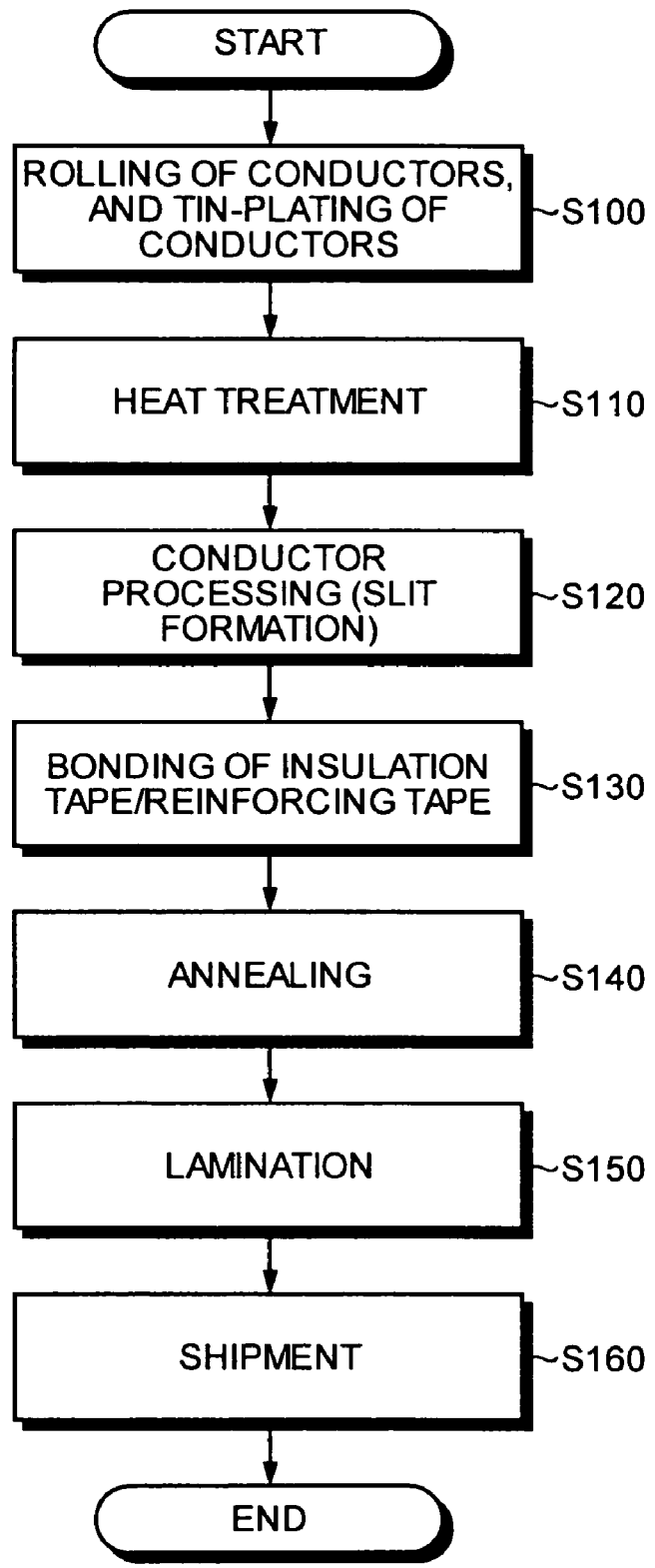

FIG.4

|  | NUMBER OF WHISKERS A | NUMBER OF WHISKERS B | WHISKER REDUCTION RATE |
|---|---|---|---|
| CONVENTIONAL TECHNIQUE | 2 | 19 | --------- |
| PRESENT EMBODIMENT | 0 | 1 | 95% |

FLEXIBLE FLAT CABLE AND METHOD OF MANUFACTURING THE SAME

BACKGROUND OF THE INVENTION

1) Field of the Invention

The present invention relates to a flexible flat cable (FFC) that is used to connect between printed circuit boards.

2) Description of the Related Art

FFCs are used to connect between printed circuit boards of various kinds of electronic devices. One-side strip conductor type FFCs are known in the art. In the one-side strip conductor type FFC, a plurality of conductors is laid out at specific distance and an insulator is placed between the adjacent conductors thereby forming a conductor unit. Subsequently, the front and the back surfaces of the conductor unit are laminated with an insulation sheet, then, the conductor unit is stripped at both ends, and a reinforcing tape is bonded to one of the surfaces.

To have a better connection performance, a metal plating is provided on the surface of the conductors. Leaded solder was used as the plating material in the past. However, because lead is toxic, non-leaded tin alloy plating is becoming popular day-by-day. However, there is a problem with the tin alloy plating that whisker is generated.

Whisker is a whiskered crystalline product that is generated on the surface of a plated surface. The generation of the whisker is not desirable; because, the whisker can short-circuit the conductors. The whisker can be generated due to various reasons. For example, the whisker can be generated due to mechanical residual stress in the plated conductor, or due to chemical corrosion of the plated surface due to reaction with metal particles and/or humidity.

FIG. 1 is a flowchart of a method of manufacturing the conventional FFCs. At step S1, a conductor material is rolled, a tin alloy is plated onto the rolled conductor material. At step S2, an electric current is passed through the conductor material to heat treat the conductor material. This heat treatment suppress the generation of whisker. Due to the heat treatment, the tin-alloy plating is re-crystallized. At step S3, plural slits are formed on the conductor material, thereby forming a plurality of conductors laid out with a predetermined interval therebetween. At step S4, an insulation tape is bonded to the conductors in such a manner that there is the insulation tape between adjacent conductors, and a reinforcing tape is bonded to one of both end surfaces, thereby forming a conductor unit including the conductors and the insulation tape. At step S5, an insulation sheet is thermally bonded to the front and the back surfaces of the conductor unit, thereby laminating the conductor unit with the insulation sheet. At step S6, the FFC is packed and shipped.

Japanese Patent Application Laid-Open No. 2001-43743 discloses a different method. A conductor is configured by a tin-copper alloy plated pillar conductor that is provided with a tin-copper alloy plated layer including copper by 0.1 weight percent to 5.0 weight percent and tin and an unavoidable impurity by the rest of the weight on the external periphery of a conductor strand. This conductor suppresses the generation of whisker, and improves solder wetness.

In the method explained with reference to FIG. 1, the conductor processing (step S3) and the bonding of insulation tape (step S4) are performed after performing the heat treatment (step S2). The conductor processing (step S3) and the bonding of insulation tape (step S4) include processes such as slit formation, cutting, and pressing that exert external stress on the conductor unit. This external stress generates the whisker.

In the method disclosed in Japanese Patent Application Laid-Open No. 2001-43743, plating of the conductor material is complex and troublesome process. Moreover, this method also requires that the conductor processing (step S2) and the bonding of insulation tape (step S4) be carried out. Because the conductor processing (step S2) and the bonding of insulation tape (step S4) exert stress on the conductor unit, the whisker is generated anyway.

SUMMARY OF THE INVENTION

It is an object of the present invention to provide a flexible flat cable with less whisker.

According to an aspect of the present invention, a method of manufacturing a flexible flat cable that is prepared by covering a conductor unit including a plurality of tin-alloy plated conductors with an insulation base material such that the conductor unit is stripped at both ends includes a first step of preparing the conductor unit including the tin-alloy plated conductors and an insulator that is present between the tin-alloy plated conductors; a second step of heat treating the prepared conductor unit; and a third step of covering the heat-treated conductor unit with the insulation base material in such a manner that a surface of the conductor unit is stripped at both ends.

According to another aspect of the present invention, a flexible flat cable prepared by executing a conductor unit processing of preparing a conductor unit including a plurality of tin-alloy plated conductors and an insulator present between the tin-alloy plated conductors, and a cover processing of covering the conductor unit with an insulation base material such that the conductor unit is stripped at both ends. The conductor unit is prepared by heat treating the conductor unit between the conductor unit processing and the cover processing.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a flowchart of a method of manufacturing a FFC according to an embodiment of the present invention;

FIG. 4 is a schematic for explaining a comparison between the conventional FCC and the FCC according to the present embodiment in terms of the generation of the whisker.

DETAILED DESCRIPTION

Exemplary embodiments of the present invention will be explained in detail below with reference to the accompanying drawings. The present invention is not to be limited to these embodiments.

According to the present invention, heat treatment (annealing) is performed after the conductor processing and the bonding of insulation tape and before the lamination. The heat treatment is performed at temperature of 180° C. to 250° C. which corresponds to the melting point of the tin-alloy plating. In the following explanation, tin-alloy plating means just plating with tin or plating with an alloy of tin.

If the heat treatment is carried out only before the conductor processing and the bonding of insulation tape, the external stress exerted on the conductor unit during these steps promote generation of the whisker. An insulation sheet as an insulation base material that covers the conductor unit of the FFC cannot be heat treated after the manufacturing of the FFC or after the lamination step, because the insulation sheet usually has a low heat resistance (for example, a rated temperature is 80 to 110° C.).

On the contrary, in the present invention, because the heat treatment (annealing) is performed even after the conductor processing and the bonding of insulation tape and before the lamination, no external stress is exerted on the conductor unit so that less whisker is generated than in the conventional FCC.

Generally, at a pre-stage of the conductor processing step, the conductor material is rolled. A tin alloy is plated to the rolled conductor material, and the conductor member is heated. Therefore, in this case, when the heat treatment is carried out immediately before the lamination step as in the present invention, the heat treatment is carried out twice during the total process of the FFC. When the heat treatment is carried out twice, the crystal grain on the tin-alloy plated surface becomes fine, as compared with the crystal grain according to the conventional technique. Consequently, the effect of suppressing whisker is improved.

Figure 1:
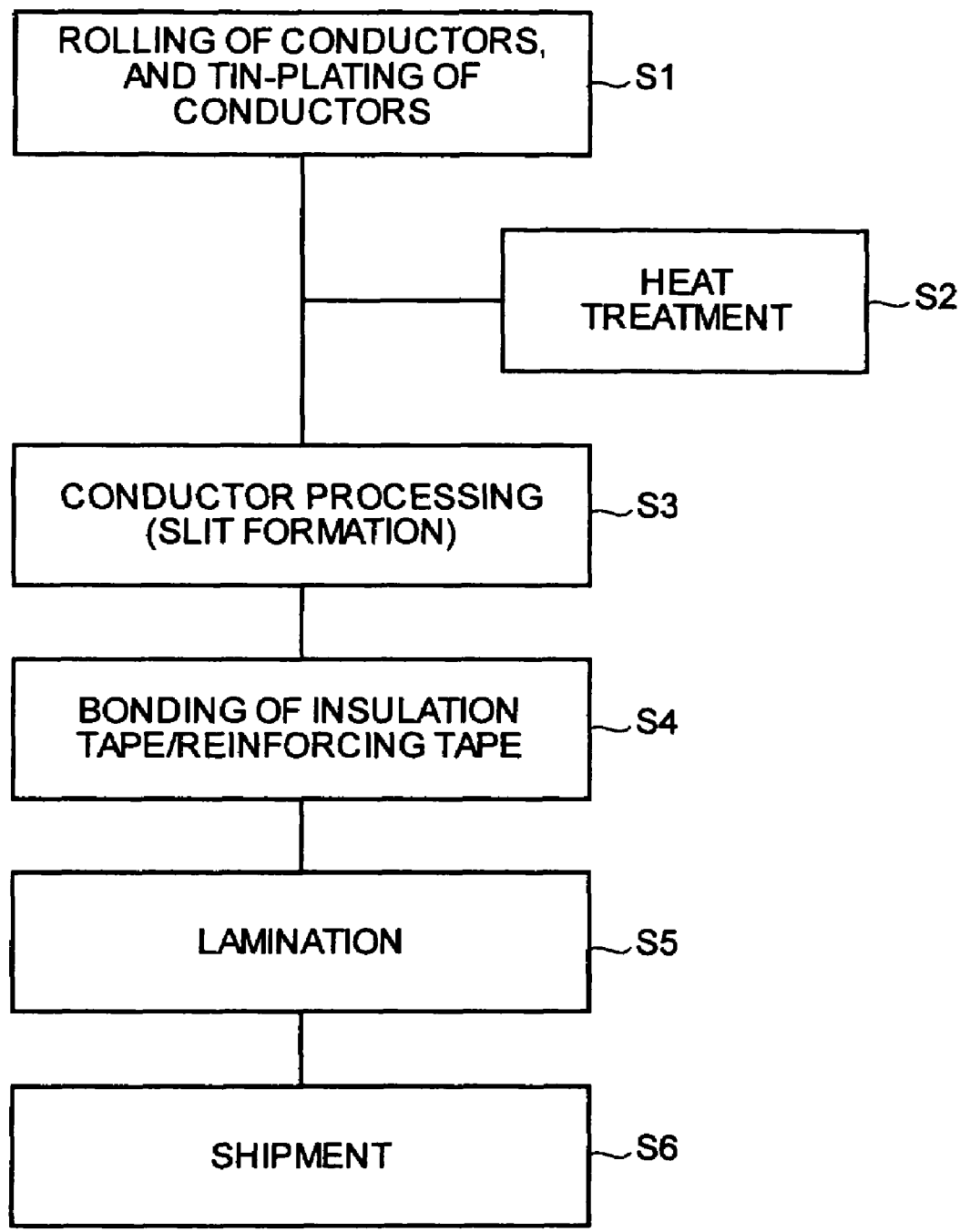
FIG. 1 is flowchart of a method of manufacturing the conventional FFC.
Figure 2A:
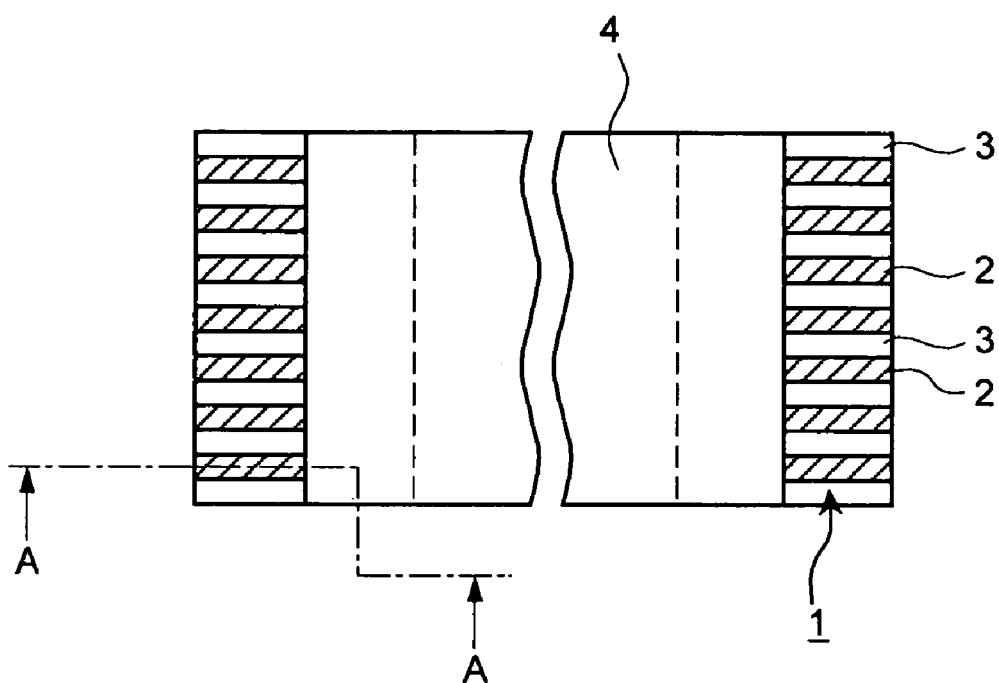
FIG. 2A is a top plan view of an external configuration of an FFC.

An embodiment of the present invention is explained below taking the one-side strip conductor type FFC as an example. FIG. 2A is a top plan view of the one-side strip conductor type FFC according to the present invention, and FIG. 2B is a cross-section along the line A-A shown in FIG. 2A.

Figure 2B:
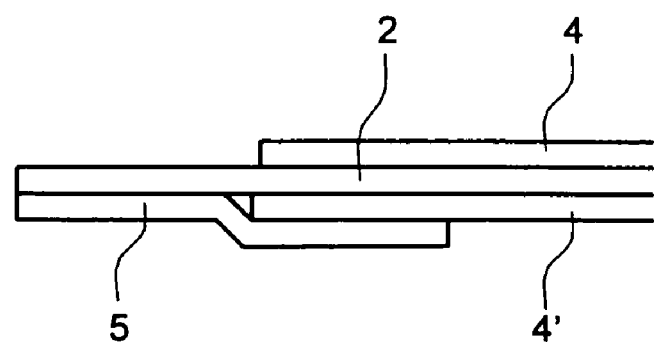
FIG. 2B is a cross-section of the FFC cut along a line A-A in FIG. 2A.

As shown in FIGS. 2A and 2B, the FFC includes a plated conductor unit 1, two insulation sheets (insulation base material) 4 and 4' that cover the plated conductor unit 1, and a reinforcing tape 5.

The conductor unit 1 includes a plurality of conductors (conductors) 2 laid out at a specific distance, and an insulator 3 between adjacent conductors. The conductor 2 is prepared by plating a tin alloy on a conductive material. The conductor unit 1 is sandwiched between the insulation sheets 4 and 4'. The insulation sheets 4 and 4' can be made from polyester resin. A part of the front surface of the conductor unit 1 is open, i.e., this part is not covered with the insulation sheet. The reinforcing tape 5 is bonded to a part of the back surface of the conductor unit 1 and a part of the insulation sheet 4'. In other words, a conductor strip is provided on only the front surface at both ends of the FFC.

FIG. 3 is a flowchart of a method of manufacturing the FFC shown in FIG. 2. The steps S100 and S110 are usually carried out by the conductor manufacturer. At step S100, the conductor material is rolled, and a tin alloy is plated to the rolled conductor material. At step S110, the tin-plated conductor material is heat treated to about 200° C. This heat treatment is carried out to suppress the generation of whisker. The tin-alloy plating is recrystallized by this heat treatment. The heat treatment can be annealing, or can be heating by passing a current to the conductor member. The conductor manufacturer manufactures the tin-plated conductor material and winds the tin-plated conductor material in a roll shape. The rolled conductor material is then delivered to an FFC manufacturer.

Steps S120 to S160) are carried out by the FFC manufacturer. At step S120, the conductor is processed. In other words, the rolled tin-plated conductor material is cut to obtain a conductor plate having a required FFC length and a plurality of slits is formed on this conductor plate to prepare a conductor unit having a plurality of conductor units laid out with a predetermined interval therebetween. The conductor unit has a comb shape. Since each slit is extended from one end to immediately before the other end, the conductors are not separated.

At step S130, an insulation tape is bonded, using an adhesive, to the conductor unit that is formed with the slits, thereby providing the insulator 3 between the conductors 2. The other end of the conductor unit that is not formed with the slits is cut and removed. The reinforcing tape 5 is bonded to back surfaces at both ends of the conductor unit. In the FFC shown in FIG. 2, since the reinforcing tape 5 covers one end of the insulation sheet 4, the FFC can be manufactured easier when the step of bonding the reinforcing tape 5 is carried out after the lamination step. When the insulation sheet 4 is formed to cover one end of the reinforcing tape 5, the step of bonding the reinforcing tape 5 is carried out before the lamination step. In this way, the conductor unit (the plated conductor unit) consisting of the conductors 2 and the insulator 3 is formed.

At step S140, the plated conductor unit is heat treated by annealing at about 180 to 250° C. for a predetermined time. As a result, the crystal grain on the tin-alloy plated surface becomes finer, thereby improving the effect of suppressing the generation of whisker.

At step S150, the insulation sheets 4 and 4' as an insulation base material is thermally compressed to the front and the back surfaces of the heat-treated plated conductor unit at 100° C. or below, thereby sandwiching (laminating) the plated conductor unit with the insulation sheets 4 and 4'. In this case, the conductor unit is covered with the insulation base material 4 such that the conductor units are exposed on the surface opposite to the surface to which the reinforcing tape 5 is bonded at both ends of the plated conductor unit. When the reinforcing tape 5 is to be bonded after the lamination step, the insulation sheets 4 and 4' are laminated such that the conductor units are exposed on the front and the back surfaces at both ends of the plated conductor unit, and thereafter, the reinforcing tape 5 is bonded to one surface at both ends of the plated conductor unit. The FFC manufactured in this way is shipped (step S160).

FIG. 4 is a schematic for explaining the difference between the conventional FCC and the FCC according to the present embodiment in terms of the generation of the whisker. In this experiment, three FFCs having a tin-alloy plated conductor of 50 poles are engaged with a predetermined connector. Ten contacts are observed at random with an electron microscope for presence or absence of the whisker. The whisker were classified into two categories: whisker A and whisker B. Whiskers A are whisker of length not smaller than 50 micrometers and whiskers B are whisker of length not greater than 50 micrometers.

Two whiskers A and nineteen whiskers B were found in the conventional FFC. On the other hand, no whisker A was found and only one whisker B was found in the FFC according to the present embodiment. In this manner, although 21 whiskers were found in the conventional FCC, only one whisker was noticed in the FCC according to the present embodiment. Thus, the whiskers were reduced by 95%. In other words, the FFC according to the present embodiment has an extremely small number of generated whiskers as compared with the FFC manufactured according to the conventional technique. The effect of suppressing the generation of whisker by reannealing is considered to be extremely high.

As explained above, according to the present embodiment, heat treatment is carried out twice in total, before the conductor processing step and immediately before the lamination step. Immediately before the lamination step, the heat treatment is carried out at a temperature of 180° C. to 250° C. which corresponds to the melting point of the tin-alloy plating. Therefore, as compared with the conventional technique of heat treating only before the conductor processing step, the technique according to the present embodiment provides a finer crystal grain on the tin-alloy plated surface, which improves the effect of suppressing the generation of whisker. Further, according to the present embodiment, since the heat treatment is executed immediately before the lamination step after which there is no step of applying a strong stress to the conductor unit, the effect of suppressing the generation of whisker due to the heat treatment is not reduced. As a result, generation of whisker can be substantially decreased, as compared with a decrease according to the conventional technique.

While the present invention is applied to the one-side strip conductor type FFC in the present embodiment, the present invention can be also applied to an FFC of the type that the front surface is stripped at one end and the back surface is stripped at the other end of the FFC.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

This application claims priority from Japanese Patent Application 2004-210163, filed Jul. 16, 2004, which is incorporated herein by reference in its entirety.

What is claimed is:

1. A method of manufacturing a flexible flat cable that is prepared by covering a conductor unit including a plurality of tin-alloy plated and heat treated conductors with an insulation base material such that the conductor unit is stripped at both ends, comprising:
    a first step of preparing the conductor unit including the tin-alloy plated and heat treated conductors having a plurality of slits and an insulator that is present between the tin-alloy plated and heat treated conductors;
    a second step of annealing the prepared conductor unit at a first temperature to suppress generation of whisker; and
    a third step of covering the annealed conductor unit with the insulation base material, using a thermal compression at a second temperature lower than the first temperature, and in such a manner that a surface of the conductor unit is stripped at both ends.

2. The method of manufacturing according to claim 1, wherein
    the first temperature is substantially the melting point of the tin-alloy.

3. The method of manufacturing according to claim 2, wherein
    the first temperature is 180° C. to 250° C.

4. The method of manufacturing according to claim 2, wherein
    the second temperature is about a rated temperature of the insulation base material.

5. The method of manufacturing according to claim 1, wherein the first step includes bonding a reinforcing tape to one of both surfaces of the conductor unit.

6. The method of manufacturing according to claim 1, further comprising bonding a reinforcing tape to a surface other than the striped surface of the conductor unit.

* * * * *